United States Patent [19]

Douglas et al.

[11] 3,880,676

[45] Apr. 29, 1975

[54] METHOD OF MAKING A SEMICONDUCTOR DEVICE

[75] Inventors: Edward Curtis Douglas, Princeton; Chung Pao Wu, Cranbury; Charles William Mueller, Princeton, all of N.J.

[73] Assignee: RCA Corporation, New York, N.Y.

[22] Filed: Oct. 29, 1973

[21] Appl. No.: 410,548

[52] U.S. Cl. ................. 148/1.5; 148/187; 148/188; 357/91

[51] Int. Cl. ................................ H01l 7/54

[58] Field of Search .................... 148/1.5, 187, 188; 317/235

[56] References Cited

UNITED STATES PATENTS

| | | | |
|---|---|---|---|
| 3,279,963 | 10/1966 | Castrucci et al. | 148/188 |
| 3,354,008 | 11/1967 | Brixey, Jr. et al. | 148/187 |
| 3,364,085 | 1/1968 | Dahlberg | 148/187 |
| 3,502,517 | 3/1970 | Sussman | 148/188 |
| 3,638,300 | 2/1972 | Foxhall et al. | 148/1.5 X |
| 3,696,276 | 10/1972 | Boland | 317/235 |
| 3,756,861 | 9/1973 | Payne et al. | 148/1.5 |

*Primary Examiner*—L. Dewayne Rutledge
*Assistant Examiner*—J. M. Davis
*Attorney, Agent, or Firm*—H. Christoffersen; A. I. Spechler

[57] ABSTRACT

In a method of making a transistor by ion implantation, wherein an emitter region is ion implanted through a window in a layer of silicon dioxide, a capping layer of silicon nitride is deposited over the emitter region before annealing the transistor, whereby out diffusion and evaporation of the emitter dopant atoms are prevented.

8 Claims, 6 Drawing Figures

METHOD OF MAKING A SEMICONDUCTOR DEVICE

Figure 1:
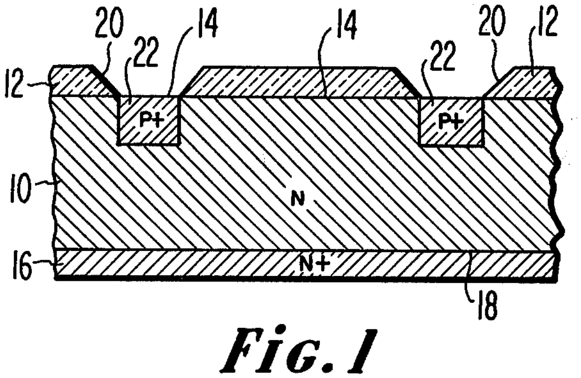

This invention relates generally to a method of making a semiconductor device, and, more particularly, to a method of annealing the device to prevent out diffusion and/or evaporation of dopant atoms from ion-implanted regions of the device. The novel method is useful in the manufacture of transistors by an ion implantation method.

In the manufacture of a semiconductor device, such as a transistor, by the ion implantation of dopant atoms in a wafer of silicon, the silicon of the implanted region is usually damaged. Out diffusion of the dopant atoms toward the surface of the silicon wafer and/or evaporation of the dopant atoms from the surface usually occur when conventional annealing techniques are used subsequent to the ion implantation. We have observed that the annealing operation of an ion-implanted transistor, as practiced in the prior art, is unsuitable for providing the required doping level and concentration contour of an ion-implanted emitter. In some cases, it has been found that the emitter doping concentration has been reduced as much as thirty times the concentration of that required for transistors made by conventional diffusion methods. Thus, conventional annealing of ion-implanted transistors produces reduced and variable emitter doping, and, as a consequence, the transistors have lower and varied current gain characteristics. If the emitter doping atoms are implanted deeply so as to minimize out diffusion resulting from subsequent annealing, emittercollector shorts may occur in the transistor.

The emitter doping in a transistor should be relatively high and uniform for the emitter to function in a most efficient manner. High doping at the surface provides a desired low contact resistance. Also, the diffusion lengths of the carriers at the PN junction should be long, that is, the silicon should not be damaged and the carrier lifetime should be long. An abrupt PN junction between the emitter and base regions of the transistor is also desirable.

In accordance with the novel method, an ion implanted transistor can be annealed without a substantial loss of the emitter dopant atoms to provide a device with a high, controllable, and reproducible current gain. The junction breakdown voltage and the reverse leakage current characteristics of the junctions of ion-implanted transistors manufactured by the novel method are also improved.

Briefly stated, an improvement in the method of making a semiconductor device wherein dopant atoms are ion implanted into a semiconductor material comprises (a) depositing a layer of a capping material, impenetrable to the dopant atoms by thermal diffusion, on the surface of the device after the dopant atoms are ion implanted, and (b) annealing the device, whereby out diffusion and/or evaporation of the dopant atoms from the device are prevented by the capping material.

In one embodiment of the novel method, the capping material is an insulating material different from the material on which it is deposited.

In another embodiment of the novel method the capping material is a refractory metal that does not diffuse into the semiconductor material during annealing.

In a further embodiment of the novel method the capping material is the same material as the semiconductor material into which the dopant atoms are implanted, and the capping material is doped with dopant atoms similar to those that are ion implanted. The capping material, however, is a different material from the material that defines the window through which the dopant atoms were ion implanted into the semiconductor material.

An important feature of the novel method is that the capping material be capable of being etched away with an etchant that does not etch or affect (enlarge) underlying material. Unless this were so, an etchant for the capping material would also etch away the underlying material and thus widen desired small areas defined by the underlying material. Such a condition may result in a detrimental shorting of different adjacent regions of the transistor by subsequent metallization.

Another important feature of the novel method is that the capping material be applied to the ion-implanted region after the ion implanting operation but before the annealing operation. We have observed that if the capping material is applied on the region to be ion implanted before the ion-implanting operation, some of the dopant ions are trapped in the capping material (usually silicon dioxide or silicon nitride) during ion implantation with the result that the capping material becomes very etch resistant, hard, brittle, tends to crack during the annealing operation and is very difficult to remove when desired. A crack in the capping material allows out diffusion and evaporation of the ion implanted atoms to escape. Also, by trapping some dopant ions in the previously applied capping material, it is difficult to obtain desired high doping concentrations in certain regions in reasonably short periods of time.

The novel method will be described as used in the manufacture of a bipolar transistor, but it will be understood that the novel method is not limited to transistors and may be employed in any ion-implanted device wherein annealing is necessary and/or desirable subsequent to the implantation of dopant atoms.

The novel method will be explained with the aid of the accompanying drawings wherein:

FIGS. 1–6 are fragmentary, cross-sectional, side elevational drawings of an NPN transistor of circular symmetry in different stages of manufacture by ion implantation.

Referring now to FIG. 1 of the drawing, there is shown a semiconductor wafer 10, such as a wafer of single-crystal, N-type silicon in the process of making an NPN transistor. The wafer 10 has a thickness of about 0.025 cm, and has a donor carrier concentration of about $1\times10^{15}/cm^3$. A layer 12 of thermally-grown silicon dioxide, having a thickness of about one $\mu$m is grown on the upper surface 14 of the wafer 10; and an N+ collector contact layer 16, having a thickness of about one $\mu$m is formed in the lower surface 18 of the wafer 10. The thermally grown silicon dioxide layer 12 can be formed in a manner well known in the art, as by heating the wafer 10 in steam. The N+ contact layer 16 can be formed by the diffusion of a suitable dopant, such as phosphorus dopant atoms, from a doped layer of silicon dioxide which is subsequently removed. The maximum donor carrier concentration in the N+ contact layer is preferably greater than $5\times10^{19}/cm^3$.

An opening, such as an annular window 20, is formed in the silicon dioxide layer 12, as shown in FIG. 1. An annular base contact well 22 is then formed by the ion implantation of boron dopant atoms preferably with a maximum carrier concentration of greater than $5\times10^{19}/cm^3$.

Figure 2:
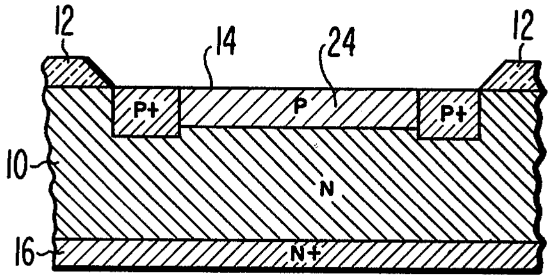
Figure 3:
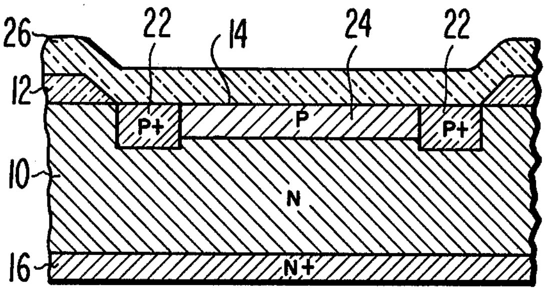

A portion of the silicon dioxide layer 12 defined by the annular base contact well 22, is etched away, as with buffered hydrofluoric acid; and a base region 24 is formed in the wafer 10, as shown in FIG. 2. Boron dopant atoms are ion implanted into the region 24 with a maximum carrier concentration of between about $1\times10^{16}$ to $1\times10^{17}/cm^3$.

Figure 4:
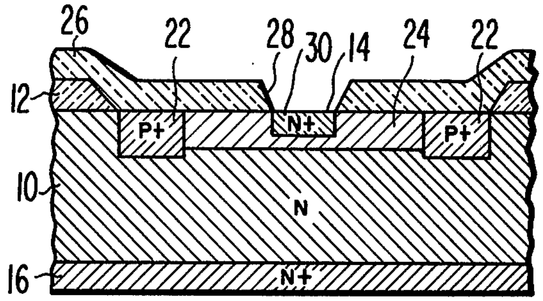

The device thus far constructed may be annealed at this point, if desired or necessary, because of damage to the silicon structure of the wafer 10 caused by the ion implantation up to this point. Before successful annealing can be carried out, however, the base contact well 22 and the base region 24 should be capped with an ion-impenetrable capping material, such as a silicon dioxide layer 26, for example, as shown in FIG. 4, to prevent the escape of the ion implanted atoms. Thus capped, the device (FIG. 3) can be annealed, for example, for about 15 minutes at a temperature of about 1,000°C in an atmosphere of nitrogen, substantially without any loss of implanted ions.

Means are provided to define an opening, or window, for an emitter region. To this end, the silicon dioxide layer 26, having a thickness of about 0.5 μm is utilized. The silicon dioxide layer 26 is deposited by vapor deposition from the reaction of silane in oxygen in a manner well known in the art. By photolithographic techniques, well known in the semiconductor manufacturing art, a window 28 is formed in the silicon dioxide layer 26 to expose a portion of the surface 14 of the wafer 10, as shown in FIG. 4. Emitter dopant atoms, such as arsenic atoms with a maximum concentration of between about $5\times10^{19}$ to $5\times10^{20}/cm^3$, are now ion implanted through the window 28 to form an emitter region 30 of the device. If the device, as shown in FIG. 4 were to be annealed now, as by conventional annealing in the prior art, substantially all of the ion-implanted dopant atoms in the emitter region 30 would out diffuse and/or evaporate through the portion of the surface 14 defined by the window 28, and thereby reduce the efficiency and operating characteristics of the transistor.

Figure 5:
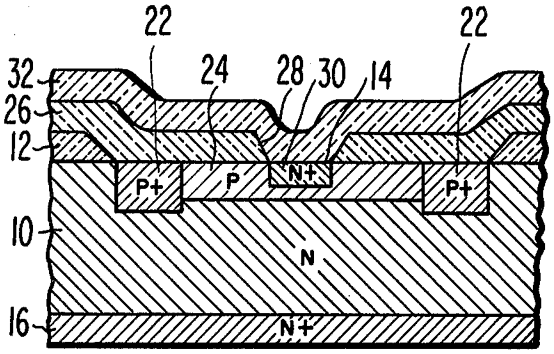
Figure 6:
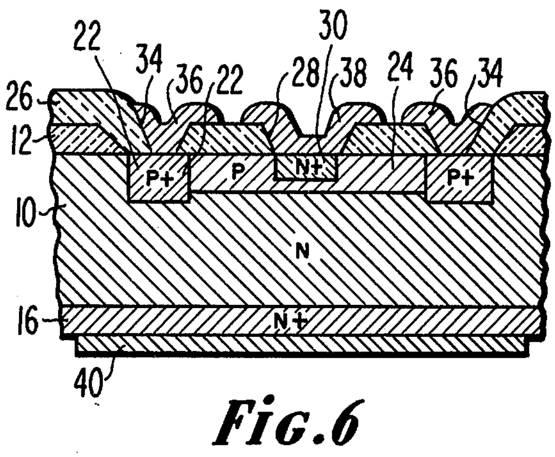

In accordance with the novel method, the semiconductor device, as shown in FIG. 4, can be annealed without impairing its efficiency by first depositing a capping material, impenetrable by thermal diffusion to the dopant atoms in the emitter region 30, on the surface 14 and within the window 28. Thus, a layer 32 of silicon nitride is deposited over the silicon dioxide layer 26 and over the surface 14 of the wafer 10 within the window 28 that defines the emitter region 30, as shown in FIG. 5. When so capped, the semiconductor device can be annealed, in an ambient of nitrogen, at a temperature of between about 700°C and 1,000°C for between about 15 minutes and 1 hour substantially without any loss of any of the dopant atoms in the emitter region 30.

The capping material 32 is preferably material which can be subsequently removed, after the annealing operation, without destroying or etching away any of the underlying layers. When the layer 26 is of silicon dioxide, it is preferable that the superimposed layer 32 be one that can be removed by an etchant that does not affect the underlying silicon dioxide layer 26. The silicon nitride layer 32 can be easily removed with an etchant of hot phosphoric acid without affecting the underlying layer 26 of silicon dioxide. Since the width of the emitter region 30 may be in the order of one or two μm, it is important not to remove any more of the layer 32 than directly over the emitter region 30 to prevent any subsequent metal contact shorting of the emitter region 30 to the base region 24.

After the annealing operation, the silicon nitride layer 32 is removed, as with hot phosphoric acid, and an annular window 34 is etched through the silicon dioxide layer 26 over the base contact region 22.

Metal contacts are now formed, as by photolithographic techniques and the vapor deposition of layers of chromium and gold within the annular window 34 and the window 28 to form base and emitter contacts 36 and 38, respectively, in a manner well known in the art. A metal contact 40 of chromium and gold is similarly provided on the collector contact layer 16.

In the novel method it is important that the capping material, to prevent out diffusion and/or evaporation of dopant atoms from a semiconductor material during annealing, be capable of being etched with an etchant which does not etch underlying layers of material. Thus, if the capping material is silicon nitride, the underlying material is preferably silicon dioxide, as shown in FIG. 5, and vice versa. The capping material should be impenetrable to the dopant atoms by thermal diffusion and should not itself diffuse easily into the underlying regions. Hence, the capping material may also be a refractory metal having a melting point higher than that of the temperature used during the annealing operation. Also, the metal should not diffuse into the semiconductor material during annealing. Suitable metals for capping material are, for example, tungsten, molybdenum, platinum, palladium and combinations thereof.

A layer of suitably doped silicon, such as arsenic doped silicon, for example, can be used as a capping material. The doped layer may have a thickness of between one and five μm and may be deposited from the vapor state by the reduction of silane in the presence of the dopant, in a manner well known in the art. Since the layer of doped silicon deposited from the vapor state forms an epitaxial layer of doped silicon, it can function as a suitable capping material for the ion-implanted emitter region 30. Thus, looking at FIG. 5, if the layer 32 were epitaxially deposited doped silicon, and if the doping material are dopant atoms similar to those that were ion implanted into the emitter region 30, the transistor can be annealed without a loss of any of the ion-implanted dopant atoms. This is possible because out diffusion and evaporation from doped epitaxially deposited silicon is relatively very much slower than that from silicon (emitter region 30) into which the dopant atoms have been ion implanted.

If the base, emitter, and collector contacts 36, 38 and 40, respectively, are any of the aforementioned metals or combinations thereof, the transistor device can be annealed initially in its completed stage substantially without any loss of dopant atoms, thus eliminating some steps in the manufacturing process.

While the novel method has been described and illustrated with the manufacture of an NPN transistor, it is understood that the method is equally applicable with the manufacture of any other semiconductor devices comprising ion-implanted regions. Also, none of the numerical values mentioned in the aforementioned structure and method are critical, the values given being merely by way of example.

What is claimed is:

1. In a method of making a semiconductor device wherein dopant atoms are ion implanted into a semiconductor material through a portion of a surface thereof, defined by one material the improvement comprising the steps of:

depositing a layer of a capping material, impenetrable to said dopant atoms by thermal diffusion, on said portion of said surface after said dopant atoms are ion implanted, said capping material being etchable by an etchant to which said one material is resistant, and annealing said device, whereby out diffusion and evaporation of said dopant atoms through said portion of said surface are prevented.

2. In a method as described in claim 1, wherein:

the step of annealing comprises heating said device to a temperature of between about 700°C and 1,000°C for between about 15 minutes and 1 hour, and said portion of a surface of semiconductor material is defined by a window in said one material, and said capping material is of a different material from said one material.

3. In a method as described in claim 1, wherein:

said portion of a surface of said semiconductor material is defined by an opening in a layer of silicon dioxide, the step of depositing a layer of capping material comprises depositing a layer of silicon nitride on said portion of said surface.

4. In a method as described in claim 1, wherein:

said portion of a surface of said semiconductor material is defined by an opening in a layer of silicon nitride, the step of depositing a layer of capping material comprises depositing a layer of silicon dioxide on said portion of said surface.

5. In a method as described in claim 1, wherein:

said portion of a surface of said semiconductor material is defined by an opening in a layer of insulating material, the step of annealing comprises heating said devices to a temperature of between about 700°C and 1,000°C for between about 15 minutes and 1 hour, and the step of depositing a layer of capping material comprises depositing a layer of a metal having a melting point higher than the temperature used in the step of annealing, said metal being incapable of diffusing into said semiconductor material at 1,000°C.

6. In a method as described in claim 5, wherein:

said metal having a melting point higher than the temperature used in the step of annealing is one chosen from the group consisting of tungsten, molybdenum, platinum, and palladium.

7. In a method as described in claim 1, wherein:

said device is a transistor, said portion of said surface comprises an emitter region of said transistor defined by a window in a layer of silicon dioxide, the step of depositing a layer of a capping material comprises depositing a layer of silicon nitride on said portion of said surface, and the step of annealing said device comprises heating said transistor to a temperature of between about 700°C and 1,000°C for between about 15 minutes and 1 hour.

8. In a method as described in claim 1, wherein:

said semiconductor material is silicon, and said capping material is a layer of silicon doped with atoms similar to those that were ion implanted into said semiconductor material.

* * * * *